United States Patent [19]

Lukianoff

[11] Patent Number: 4,575,630
[45] Date of Patent: Mar. 11, 1986

[54] ELECTRON-BEAM TESTING OF SEMICONDUCTOR WAFERS

[75] Inventor: George V. Lukianoff, Hopewell Junction, N.Y.

[73] Assignee: IBM Corporation, Armonk, N.Y.

[21] Appl. No.: 575,353

[22] Filed: Jan. 30, 1984

[51] Int. Cl.$^4$ ............................................. G01N 23/00
[52] U.S. Cl. .................................... 250/307; 250/310
[58] Field of Search ............. 250/306, 307, 310, 492.2

[56] References Cited

U.S. PATENT DOCUMENTS

| | | | |
|---|---|---|---|
| 3,772,520 | 11/1973 | Varker | 250/307 |
| 3,984,683 | 10/1976 | Larach | 250/310 |
| 4,238,686 | 12/1980 | Chin et al. | 250/310 |

Primary Examiner—Bruce C. Anderson
Attorney, Agent, or Firm—Perman & Green

[57] ABSTRACT

A method for examining non-metallized semiconductor wafers without the use of any electrical or mechanical contact therewith is provided by the scanning of the wafer with an electron beam. The bombardment of the wafer with the electrons generates charges which are retained in the semiconductor material for a period of time depending on the structure and properties thereof. Defects in the structure, particularly in the structure of junctions, result in a diffusion of the charges with a consequent alteration in the energy of secondary emission which is also produced by the electron bombardment. The secondary emission is measured as the beam is scanned from point to point along the wafer to provide an image of the wafer. Differences in the intensity of points on the image show the desired junction characteristics and also indicate the locations of the defects in the wafer.

5 Claims, 2 Drawing Figures

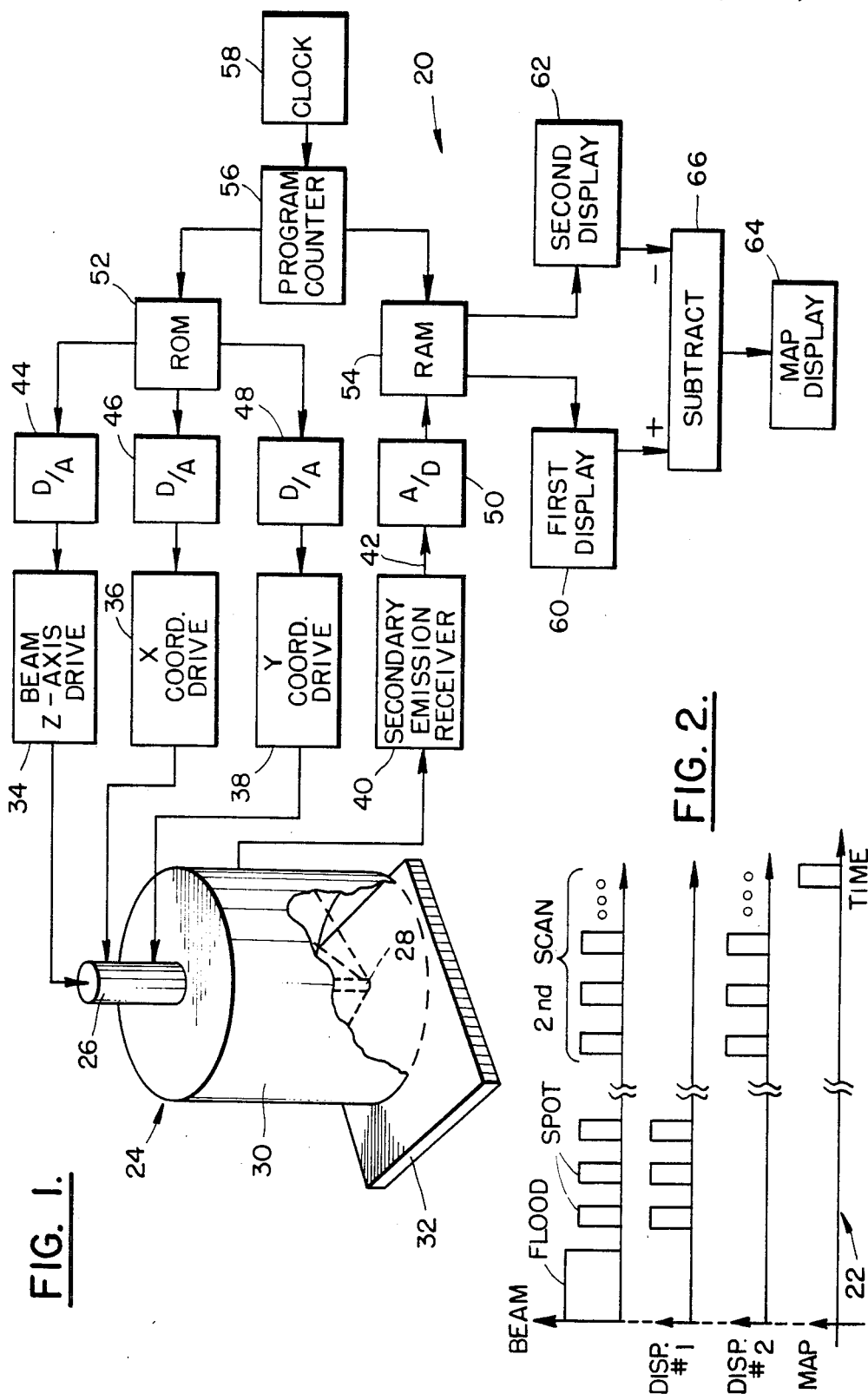

ELECTRON-BEAM TESTING OF SEMICONDUCTOR WAFERS

BACKGROUND OF THE INVENTION

This invention relates, in general, to the testing of semiconductor wafers and, more particularly, to the mapping of faulty junctions in wafers by use of electron microscopes.

Semiconductor wafers may be constructed with many junctions, such as emitter-base and base collector junctions, which are used in the construction of electronic circuits on the wafers. The possibility of the presence of such faults lowers the yield in the production of semiconductor circuits. A low yield is of particular concern in very large scale integration VLSI semiconductor circuits due to the very large number of semiconductor junctions in the wafer. With increasing size and complexity of such wafers, the chance of a fault increases with a corresponding decrease in the likelihood of success in the manufacture of large circuits on a single wafer.

One technique of wafer examination employs an electron microscope in conjunction with the electrical energization of the electrical circuit on the wafer. The differences in potential across junctions and other points in the circuit are sufficient to alter the magnitude of secondary emission of electrons in response to the impingement of the electron beam. By moving the beam from point to point along the wafer circuit, differences in secondary emission occur. Reception of the secondary emission and recordation of the locations of the electron beam at each measurement of the emission provide an image of the wafer circuit. A description of the foregoing technique is provided in the magazine *Electronics*, July 14, 1981, at pages 105-112 in an article entitled "Scanning Electron Beam Probes VLSI Chips."

A second technique employs the electron microscope without the energization of an electrical circuit on the wafer to develop differing values of potential along the wafer. This technique is useful in providing pictorial presentations of the minute structures found in a transistor and other semiconductive devices. However, this technique suffers in that the information based on potential differences among circuit points is not available.

However, the combined use of circuit energization in conjunction with the electron microscope in the first technique cannot be employed in partially fabricated wafer circuits prior to the metallization step in the circuit fabrication process. This is because metal conducting paths are required to introduce the electronic potentials to the various points on the wafer. The foregoing limitation is a severe restriction on the use of the examination technique and introduces a problem in that adequate inspection of the wafer circuit cannot be accomplished part way through the fabrication process, particularly, before the metallization step.

SUMMARY OF THE INVENTION

The foregoing problem is overcome and other advantages are provided by an examination procedure for wafer circuits. In accordance with the invention, the examination procedure takes advantage of both the sharp imaging capability of the electron microscope and the added definition provided by the introduction of potential differences between different points of the wafer circuit. This is accomplished without the need for energization of a wafer circuit by an external source of electric power and, accordingly, the technique of the invention is available for inspection of partially completed wafer circuits.

It is, therefore, an object of the invention to provide for the inspection of a semiconductor wafer circuit by the use of an electron microscope in conjunction with the introduction of potential differences prior to the step of metallization in the process of fabricating the wafer circuit.

It is a further object of the invention to provide for the inspection of a semiconductor wafer circuit by the use of an electron microscope in conjunction with the introduction of potential differences without the connection of an external source of electric power to the wafer circuit.

The foregoing objectives and others are met by a recognition of the fact that differences of potential develop in a semiconductor material under illumination or irradiation by an electron current, such as that present in an electron microscope. These differences in potential develop in response to differences in doping and other variations in the semiconductor material, and are characterized by the presence of electric charges impressed upon the semiconductor material by the impinging electrons.

In the case of a partially fabricated semiconductor wafer circuit, prior to the step of metallization, it has been discovered that the foregoing electric charge is retained for a relatively long period of time after termination of the electron beam. Such charge retention is observed in properly formed semiconductor junctions. However, in improperly formed junctions, the foregoing charge tends to migrate into adjoining areas as though the junction were to "leak" charge. For example, in an improperly formed transistor structure, the initial charges produced on the emitter or collector regions might spread to other areas. Thus, the charge retention time is relatively short at an improperly formed semiconductor structure.

Thus, the invention is carried out by a mapping of a semiconductor structure having a plurality of junctions prior to the metallization step in the process of fabricating the semiconductor structure. The mapping shows defective areas, and is accomplished by three basic steps. First, the semiconductor structure is scanned with a sharply focused electron beam, this being done in the absence of introduction of potential difference by any means other than by the electron beam. Second, secondary emission resulting from the electron bombardment is measured, such measurement being manifested as a voltage. Third, the foregoing voltage is plotted as a function of the coordinates of the scanned electron beam to produce a map of the potential differences of the semiconductor structure. The resulting images on the map can be recognized as good and defective areas of the semiconductor structure. If desired, the information on the map can be used for rerouting a metallic path around a defective area during the metallization step so as to save the defective wafer.

BRIEF DESCRIPTION OF THE DRAWING

The foregoing aspects and other features of the invention are explained in the following description taken in connection with the accompanying drawing wherein:

FIG. 1 is a block diagram, partially stylized, of electron microscope apparatus and accompanying circuitry in a system for use in practicing the invention; and FIG. 2 is a timing diagram useful in explaining the operation of the system of FIG. 1.

DETAILED DESCRIPTION

With reference to FIGS. 1 and 2, there is shown a system 20 useful in practicing the method of the invention, the operation of the system 20 to be explained with reference to a timing diagram 22 (FIG. 2). The system 20 comprises an electron microscope 24 which includes an electron gun 26 for generating a beam 28 of electrons. Also included within the microscope 24 is an encircling electrode 30 for receiving secondary emission. The microscope 24 is positioned above a semiconductor wafer 32 having semiconductor circuit structures thereon. The microscope 24 is so positioned relative to the wafer 32 that the beam 28 strikes a portion of the wafer or whole wafer 32 under examination.

The system 20 further comprises three drive circuits, 34, 36 and 38, which are coupled to the gun 26. The drive circuit 34 modulates the intensity of the beam 28 along the z-axis of the microscope 24, the drive circuit 36 positions the beam 28 along the x-axis of the microscope 24, and the drive circuit 38 positions the beam 28 along the y-axis of the microscope 24. Thereby, the beam 28 can be pulsed on and off and can be scanned in two axes along the face of the wafer 32. A receiver 40 is coupled to the electrode 30 for generating electric signals on line 42 in response to the impingement of secondary emission from the wafer 32 upon the inner surface of the electrode 30. Such secondary emission occurs in response to the bombardment of the wafer 32 by the electrons of the beam 28.

The system 20 further comprises four analog-to-digital converters 44, 46, 48 and 50, and two memories 52 and 54, the memory 52 being a read-only memory and the memory 54 being a random-access memory. The memories 52 and 54 are addressed by a program counter 56 driven by a clock 58. Also included within the system 20 are three displays 60, 62 and 64, and a subtractor 66. The first and the second displays 60 and 62 receive signals outputted by the memory 54, the output signals of the memory 54 being image points of the semiconductor structure on the wafer 32. The two displays 60 and 62 permit the sequential generation of two separate images of the semiconductor structure. The image points of the second image of the display 62 are then subtracted, point by point, from the corresponding image points of the display 60, the subtraction being accomplished by the subtractor 66 with the result of the subtraction being presented on the display 64. In the event that defects in the semiconductor structure are characterized by a slow leakage of electric charge associated with the bombardment by the electron beam 28, then the second image of the display 62 will differ somewhat from the first image of the display 60. Differences occur at the locations of defects with the result that the image on the display 64 is a map of such defects.

In operation, the gun 26 is gated on and off by the beam drive circuit 34 and positioned by the drive circuits 36 and 38 so as to scan along the face of the wafer 32, the scanning being done step by step as the beam is first positioned in one location and then pulsed on for a predetermined interval of time, after which the beam is repositioned to another location on the wafer 32. In response to the striking of the wafer 32 by electrons of the beam 28, there results a charging of the semiconductor material and also the secondary emission of radiation from the site of the impinging electrons. The magnitude of the voltage produced by the receiver 40 on line 42 is a measure of the energy of the secondary emission. The voltage varies depending on the amount of charge at the site illuminated by the beam 28, and also on the physical and chemical structure of the semiconductor material at the illuminated site. Thereby, as the beam 28 is scanned from site to site, variations in the magnitude of the voltage on line 42 provide points of an image of the semiconductor structure on the wafer 32. The image points on line 42 are converted from analog signals to digital signals by the converter 50, and are then stored in the memory 54 at storage locations assigned by the counter 56.

The scan pattern and the modulation of the electron beam 28 is accomplished under control of the memory 52. Digital control signals are outputted from the memory 52 in response to the addressing thereof by the counter 56, these output digital signals being converted by the converters 44, 46 and 48 to analog signals for operation of the drive circuits 34, 36 and 38. Thereby, in response to a predetermined stored program in the memory 52, the beam 28 is made to scan in accordance with the prescribed scan pattern.

If desired, the wafer 32 may be first illuminated by a flood beam of electrons produced by the gun 26 as shown in the first graph of the diagram 22. Thereafter, the beam 28 is narrowly focused and scanned on successive spots as shown in the first graph of the diagram 22. The resulting image points attained by viewing the secondary emission are portrayed in the second graph of the diagram 22, the four graphs of the diagram being in time registration with each other. The image points of successive spots on the wafer 32, as presented in the second graph, are stored in the memory 54 and, subsequently, are read out therefrom to be presented on the first display 60. Such reading out of data is accomplished under command of the counter 56.

It may be desirable to form yet a further image of the semiconductor structure, this being accomplished by a second scanning of the beam 28 as portrayed in the first graph of the diagram 22. The resulting image points obtained by viewing the secondary emission is portrayed in the third graph, these image points being stored in the memory 54 and, subsequently, presented in the display 62. The respective image points of the two images may then be subtracted, one from the other, to provide a map of the differences in the two images, such a map showing the locations of defects in the semiconductor structure resulting from leakage of charge from junctions illuminated by the beam 28. The map of the defects appears in the third display 64. The foregoing subraction process may occur after the generation of the two images, as shown in the fourth graph of the diagram 22.

With respect to the practicing of the method of the invention, it is noted that a single scanning of the beam 28, followed by the generation of a single image on the display 60, may suffice to point out the locations of defects in the semiconductor structure. In the case of the single scan, the dwell time of the electron beam 28 at any one site is long enough to induce an electric charge at the site of the impinging electrons. In the event that a defective junction is present in the illuminated region, then the resulting charge tends to leak or diffuse away from the illuminated region with the result that the energy of the secondary emission is different than that produced from illumination of a properly structured semiconductor junction wherein there is essentially no diffusion of the electric charge. Thus, a single scanning can produce an image wherein defects can be noticed.

However, in the situation wherein the rate of charge diffusion is relatively low, it is preferable to undertake two scans spaced apart in time. During the second scan, the charged regions at the properly formed junctions are still present as a result of the first scan. The charge has been considerably reduced at the defective regions. Thereby, the plural scans and the corresponding plural images can more readily indicate the presence of a defect. Alternatively, if desired, in lieu of two separate scans, the flooding shown in the first graph can be employed prior to the scanning with the finely focused spot beam. In the use of the flood beam, all regions of the semiconductor material are initially charged and, by the time of the scanning, there has been some charge diffusion away from the defective regions so that the defective areas can be noted on the resulting image. Furthermore, as shown in the first graph, the flood beam followed by two scanning procedures may also be utilized for further definition of the defective regions in cases of low rates of diffusion of the foregoing charge.

In the use of the foregoing methodology, it is assumed that no metallic components have been formed within the semiconductor structure, as is commonly done by the step of metallization in the fabrication of a semiconductor structure. Such metallization would provide conductive paths which would immediately remove any charges generated by the impinging electrons. As a result, no detection of semiconductor defects would be noted in the resulting images. Accordingly, it is to be understood that in the implementation of the method of this invention, the semiconductor structure is to be free of any metallic components which might serve to drain off the charge.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

I claim:

1. A method of mapping areas in a semiconductor structure having a plurality of junctions, which structure has been fabricated without metallization, the method comprising the steps of:
    scanning the structure with an electron beam in the absence of potentialization of the structure by any means other than by said electron beam;
    measuring the secondary emission of radiation induced by the bombardment of the semiconductor structure by said electron beam, a measurement of the secondary emission being manifested by a first voltage;
    repeating said measuring step to obtain a second measurement manifested by a second voltage; and
    mapping a difference of said first voltage and said second voltage as a function of the coordinates of the scanning position of said electron beam to provide a map capable of identifying the presence of a defective area in the semiconductor structure.

2. A method of mapping areas in a semiconductor structure having a plurality of junctions, which structure has been fabricated without metallization, the method comprising the steps of:
    scanning the structure with an electron beam in the absence of potentialization of the structure by any means other than by said electron beam;
    measuring the secondary emission of radiation induced by the bombardment of the semiconductor structure by said electron beam, a measurement of the secondary emission being manifested by a voltage; and
    mapping said voltage as a function of the coordinates of the scanning position of said electron beam to provide a map capable of identifying the presence of a defective area in the semiconductor structure, said method further comprising a step of flooding said semiconductor structure prior to said step of scanning, said flooding inducing electric charges to areas of said semiconductor structure prior to said scanning, the electron charge induced by said flooding altering the energy of electron emission during said scanning for enhancement of image points associated with a lower rate of charge diffusion, and wherein the electron beam in said scanning is sharply focused.

3. A method according to claim 2 wherein said scanning, said measuring step, and said mapping step are repeated to provide a second map, said method further comprising a step of comparing said second map with said first mentioned map.

4. A method according to claim 3 wherein said comparing step comprises a substraction of image points of said second map from the corresponding image points of said first map to provide a resulting map of defects in said semiconductor structure.

5. A method according to claim 1 wherein said scanning is accomplished by redirecting said beam, point by point, along said semiconductor structure, said beam dwelling at each of said points a sufficient time to build up a charge on said semiconductor structure at each of said points, the amount of charge built up at each of said points being dependent on a rate of diffusing of charge into adjoining regions of said semiconductor structure.

* * * * *